United States Patent
Naniwa et al.

(10) Patent No.: US 12,361,966 B2
(45) Date of Patent: Jul. 15, 2025

(54) PRE-SOLDER BUMP PREVENTIVE OVERCOATING

(71) Applicant: Western Digital Technologies, Inc., San Jose, CA (US)

(72) Inventors: Irizo Naniwa, Fujisawa (JP); Kenichi Murata, Ebina (JP); Yuhsuke Matsumoto, Fujisawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/229,589

(22) Filed: Aug. 2, 2023

(65) Prior Publication Data
US 2024/0428821 A1    Dec. 26, 2024

Related U.S. Application Data

(60) Provisional application No. 63/523,276, filed on Jun. 26, 2023.

(51) Int. Cl.
*G11B 5/48*     (2006.01)
*H05K 3/34*     (2006.01)

(52) U.S. Cl.
CPC .......... *G11B 5/4846* (2013.01); *G11B 5/4826* (2013.01); *G11B 5/4833* (2013.01); *G11B 5/4853* (2013.01); *H05K 3/3452* (2013.01); *G11B 2220/2516* (2013.01); *H05K 2203/0582* (2013.01)

(58) Field of Classification Search
None
See application file for complete search history.

(56) References Cited

U.S. PATENT DOCUMENTS

| | | | |
|---|---|---|---|
| 4,761,699 A * | 8/1988 | Ainslie et al. | G11B 5/4853 360/234.5 |
| 5,821,494 A | 10/1998 | Albrecht et al. | |
| 8,947,830 B1 | 2/2015 | Collins | |
| 10,460,754 B2 | 10/2019 | Matsumoto et al. | |
| 11,062,731 B1 | 7/2021 | Satoh et al. | |

(Continued)

FOREIGN PATENT DOCUMENTS

JP    2011243241 A    12/2011

OTHER PUBLICATIONS

Kamano, Katayut et al., Back Side Pad Bonding of Hard Disk Head Slider, CMU.J.Nat.Sci Special Issue on Manufacturing Technology (2011) vol. 10(1), pp. 29-37.

(Continued)

*Primary Examiner* — Craig A. Renner
(74) *Attorney, Agent, or Firm* — John D. Henkhaus (57) ABSTRACT

A hard disk drive flexure assembly includes an insulative base layer over a metal substrate, a first conductive layer over the base layer, a plurality of electrical pads each comprising a second conductive layer over the first conductive layer, a pre-formed bump of solder material positioned over each pad, and a conductive cover layer over at least a portion of each pre-solder bump. With the conductive cover layer, e.g., gold, solder material from each pre-solder bump is inhibited from transferring to a probe during electrical check of the flexure, the solder material is inhibited from oxidizing, and solder splash is inhibited. These techniques are especially relevant with narrow, high-density, small pitch electrical pads.

19 Claims, 9 Drawing Sheets

(56) References Cited

U.S. PATENT DOCUMENTS

2006/0012918 A1\* 1/2006 Hashi et al. ......... H05K 3/3442
  360/234.5
2007/0097549 A1  5/2007 Yamaguchi et al.
2008/0298218 A1  12/2008 Tanaka et al.
2009/0213498 A1  8/2009 Suzuki et al.

OTHER PUBLICATIONS

Ji, Hongjun et al., Effect of the Silver Content of SnAgCu Solder on the Interfacial Reaction and on the Reliability of Angle Joints Fabricated by Laser-Jet Soldering, Journal of Electronic Materials, Feb. 2015, accepted Nov. 3, 2014 / published online Dec. 4, 2014, pp. 733-743, vol. 44 No. 2, The Minerals, Metals & Materiais Society, downloaded at https://www.researchgate.net/publication/270649812.

\* cited by examiner

PRE-SOLDER BUMP PREVENTIVE OVERCOATING

FIELD OF EMBODIMENTS

Embodiments of the invention may relate generally to hard disk drives, and particularly to approaches to preventive overcoating of pre-solder bumps for suspension electrical pads.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") housed in a slider that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic-recording disk, which in turn magnetizes a small area on the recording medium.

To write data to or read data from the recording medium, the head has to receive instructions from a controller. Hence, the head is electrically connected to the controller in some manner such that not only does the head receive instructions to read/write data, but the head can also send information back to the controller regarding the data read and written. Typically, a flexible printed circuit (FPC) mounted on a suspension is used to electrically transmit signals from the read-write head to other electronics within an HDD. At one end, the FPC-suspension assembly and the head are electrically connected together typically with solder at the head slider. To conventionally connect these components with solder, solder balls between the suspension electrical pads and the slider electrical pads are heated, such as by using a laser in a solder bond jet (SBJ) procedure.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to the formation of protective-covered pre-solder bumps, such as for a hard disk drive flexure, are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment or to every embodiment.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Figure 2A:
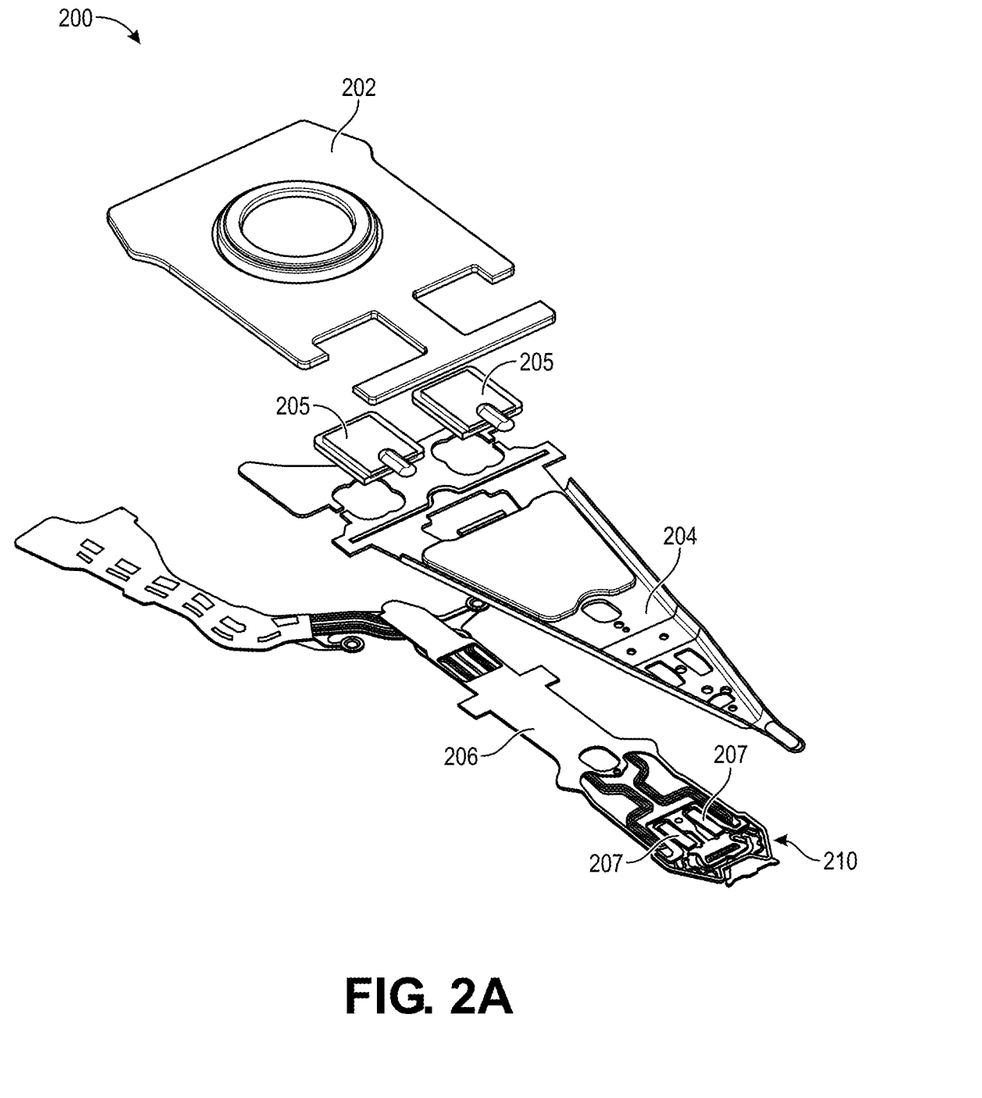
FIG. 2A is an exploded view illustrating an HDD suspension assembly, according to an embodiment.
Figure 2B:
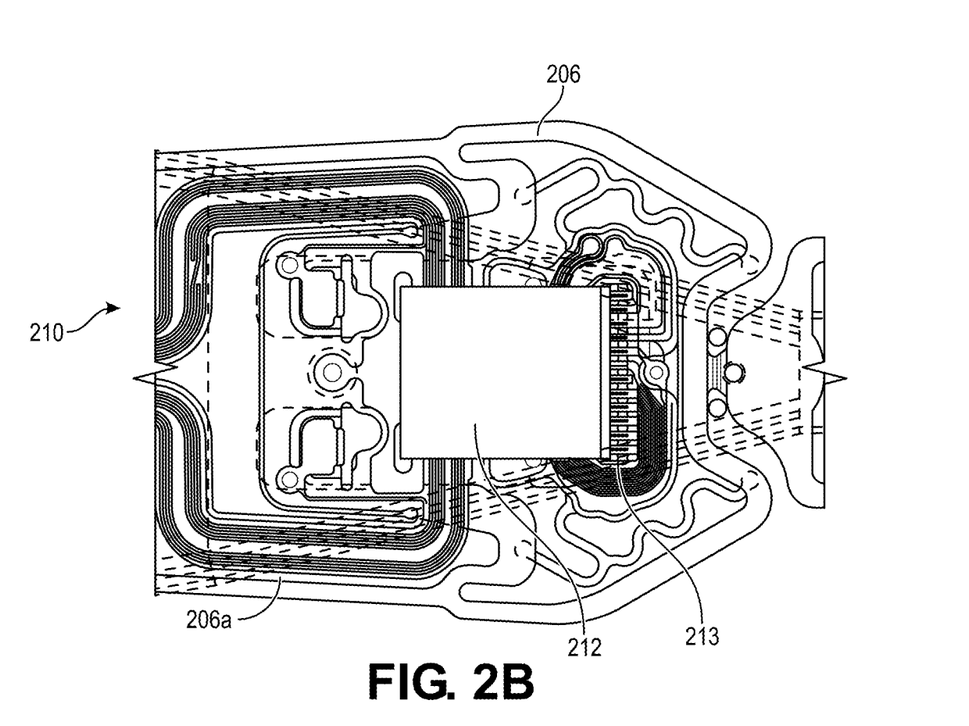
FIG. 2B is a top view illustrating an HDD head-gimbal assembly (HGA), according to an embodiment.
Figure 2C:
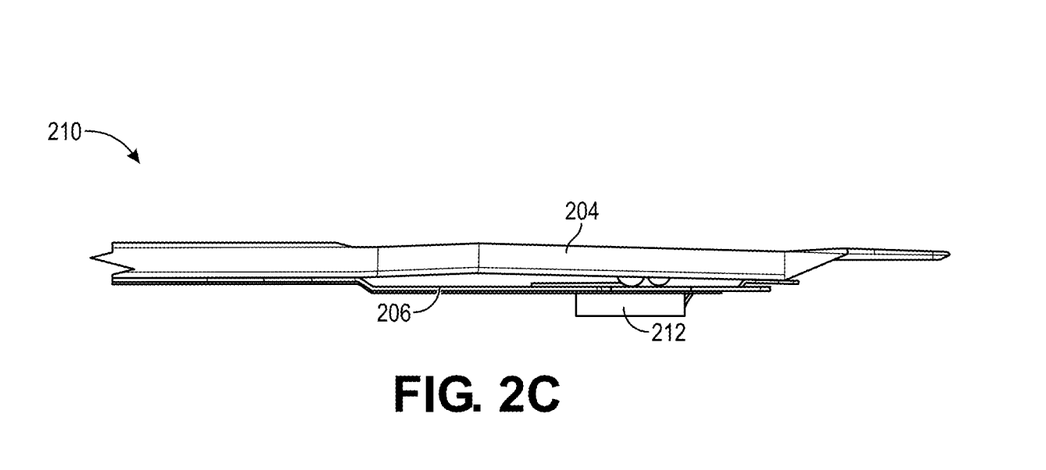
FIG. 2C is a side view illustrating the HGA of FIG. 2B, according to an embodiment.

Recall that a flexible printed circuit (FPC) mounted on a suspension is typically used to electrically transmit signals from the read-write head to other electronics within a hard disk drive (HDD), and that the FPC-suspension assembly and the head are electrically connected together with solder at the head slider via electrical pads on the respective components. FIG. 2A is an exploded view illustrating an HDD suspension assembly, according to an embodiment. Suspension 200 comprises a base plate 202, coupled with a load beam 204 with optional piezoelectric (PZT) milli-actuators 205 coupled thereto, and a flexure 206 with optional piezoelectric (PZT) micro-actuators 207 coupled thereto. Shown as constituent to or coupled to flexure 206 is/are integrated leads 206a comprising, for example, a laminate structure having a base polyimide (PI) polymer layer at least in part covered by a conductive layer (e.g., copper) at least in part covered by a cover PI layer. FIG. 2B is a top view illustrating an HDD head-gimbal assembly (HGA), according to an embodiment. An example HGA 210 as depicted here comprises a portion of the flexure 206 with integrated leads 206a, and with a head slider 212 electrically coupled (e.g., soldered 213) thereto. HGA 210 is positioned at or near a distal end of the suspension 200, opposing a proximal end at the base plate 202 side of suspension 200. FIG. 2C is a side view illustrating the HGA 210 of FIG. 2B, according to an embodiment, depicting the flexure 206 coupled with the load beam 204 and with the slider 212 attached to the flexure 206.

The number of slider electrical connections, and thus the number of electrical pads on the slider and on the flexure of the suspension, is expected to increase over time due to the implementation of new technologies such as dual thermal flying height control (TFC), two-dimensional magnetic recording (TDMR), energy-assisted magnetic recording (EAMR) such as heat-assisted magnetic recording (HAMR), microwave-assisted magnetic recording (MAMR), and the like. Consequently, to make room for the additional electrical pads the distance between adjacent pads is expected to narrow (or decrease) and the size of the pads is expected to decrease accordingly, including narrowing the pads to inhibit undesirable solder bridges (e.g., electrical bonds) between adjacent pads. Hence, as the pads increase in number it becomes more difficult to connect the pads as needed using the traditional SBJ solder balls, equipment and procedures.

As it is becoming more and more challenging to connect slider pads to flexure pads using SBJ solder balls, equipment and procedures, the use of "pre-solder" processes to form, pre-form, pre-configure "pre-solder bumps" of solder material (e.g., a metal alloy, for a non-limiting example composed of tin (Sn) or tin-silver (Sn—Ag), or a lead-free material) using photolithography mask(s) instead of using SBJ is contemplated. "Pre-solder" generally refers to pre-forming solder bumps onto electrical pads, e.g., "pre-soldering", prior to a reflow-based component bonding procedure. Implementation of pre-solder bumps is thought to have potential to reduce tact time, improve product yields, reduce fabrication inactive time, and can be used in larger pad density products (e.g., a 14-pad flexure-slider assembly) whereas SBJ appears limited in that aspect.

Approaches to formation of pre-solder bumps for suspension flexure electrical pads are described in U.S. patent application Ser. No. 17/702,691, now U.S. Pat. No. 11,705,153 entitled "Hard Disk Drive Suspension Pad Pre-Solder Formation And Guiding" and in U.S. patent application Ser. No. 17/707,368, now U.S. Pat. No. 11,908,497 entitled "Hard Disk Drive Suspension Pad Pre-Solder Sidewalls", the entire contents of both of which are incorporated by reference for all purposes as if fully set forth herein. There are at least two types of pre-solder processes using photoresist that are under consideration for this pre-solder purpose, "solder plating" and "solder paste printing and reflow". Generally with a metal plating process, a material is in some way deposited (e.g., spraying, electroplating, electroless plating, and the like) onto a workpiece. Generally with a solder paste printing process, a solder material is in some way spread onto a workpiece with a squeegee through a mask (e.g., stencil, photoresist, and the like) and then reflowed by heating to take a desirable form.

Figure 3A:
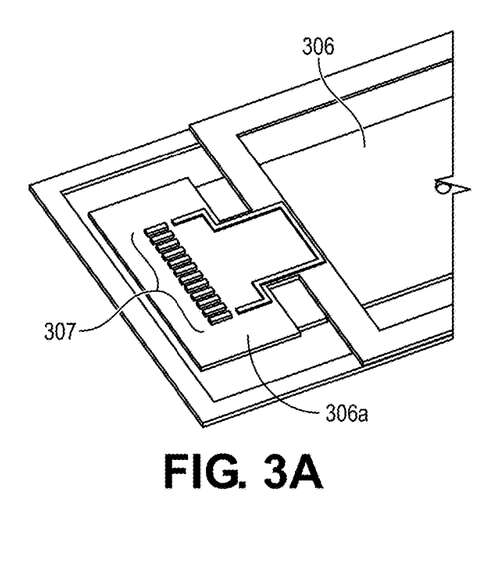
FIG. 3A is a perspective view illustrating a pre-soldered flexure, according to an embodiment.
Figure 3B:
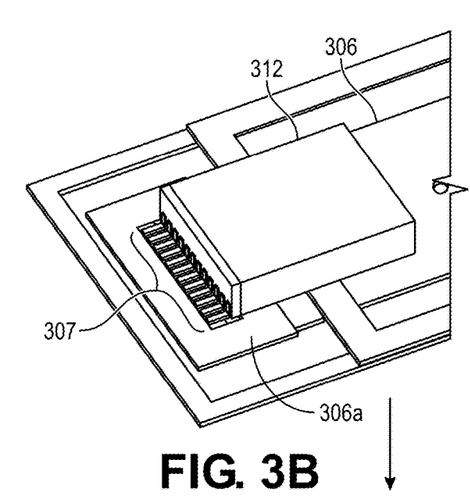
FIG. 3B is a perspective view illustrating a slider attached to the pre-soldered flexure of FIG. 3A, according to an embodiment.
Figure 3C:
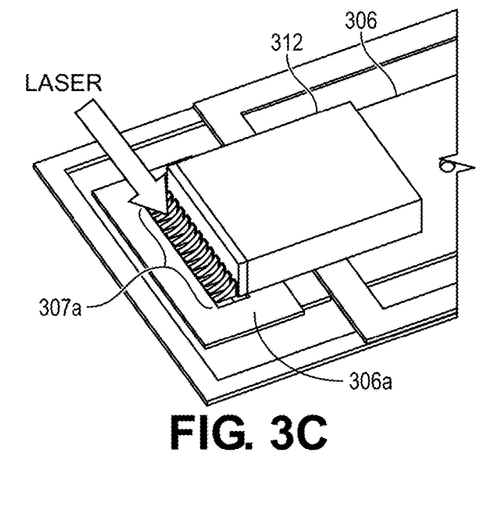
FIG. 3C is a perspective view illustrating the slider electrically-connected with the pre-soldered flexure of FIG. 3A, according to an embodiment.

FIG. 3A is a perspective view illustrating a pre-soldered flexure, FIG. 3B is a perspective view illustrating a slider attached to the pre-soldered flexure of FIG. 3A, and FIG. 3C is a perspective view illustrating the slider electrically-connected with the pre-soldered flexure of FIG. 3A, all according to an embodiment. The "pre-soldering" stage of FIG. 3A depicts a simplified form of a flexure, such as flexure 206 (FIGS. 2A-2C), labeled flexure 306. Flexure 306 comprises a flexure head-pad 306a on which a plurality of pre-solder bumps 307 are formed or "pre-soldered". In this context, each pre-solder bump 307 of solder material is formed onto or over a corresponding pad (not visible here) of flexure 306, so that each pre-solder bump 307 can be heated to reflow to then electrically bond with a corresponding slider pad. Next, the "slider attach" stage of FIG. 3B depicts a head slider 312 mechanically attached to the head-pad 306a of flexure 306, prior to electrical pad (or "connection pads", "bond pads" or simply "pads") connection. Here, the pre-solder bumps 307 are aligned with corresponding pads of slider 312 for ultimate electrical connection. Finally, the "pad connection" stage of FIG. 3C depicts the head slider 312 in the process of being electrically coupled or connected to flexure 306 via a laser reflow procedure, whereby solder fillets 307a are formed by reflowing the pre-solder bumps 307 (FIGS. 3A-3B) of the flexure 306 using a heat source (e.g., laser irradiation) to electrically interconnect slider 312 electrical pads with the corresponding flexure 306 electrical pads.

However, it has been found that solder material from pre-solder bumps can undesirably transfer to a probe (e.g., test tool) during the electrical testing of the flexure. In turn, oxidation of this transferred solder can cause deterioration of the probe performance, such as due to high contact resistance. Furthermore, oxidation of the pre-solder surface may occur, which may detrimentally affect the bondability and the wettability of the solder bump. While the general use of flux may prevent a solder bump from oxidizing, flux is not considered suitable for flexure/HGA processes due to chemical issues. Yet another concern with pre-solder bumps is the potential for "solder splash" during reflow. With solder splash, as a pre-solder bump is rapidly heated by laser reflow (especially in view of relatively rough solder surface which absorbs laser more locally), air in voids inside the solder bump can rapidly expand and generate a splash of melted solder. In view of the foregoing challenges, an improvement to pre-solder bumps may be desirable.

Electrically Conductive Protective Overcoat of Pre-Solder Bumps

According to an embodiment, at least a portion (e.g., the top surface where test probe is likely to contact) of a pre-solder bump is overcoated with a protective layer of material, which prohibits or inhibits the transfer of solder material to an electrical test probe. According to a related embodiment, electrically-conductive gold (Au) is utilized as the protective overcoat material for pre-solder bumps. According to respective embodiments, a number of fabrication procedures may be implemented for the fabrication of overcoated pre-solder bumps, as described in more detail elsewhere herein.

Figure 4:
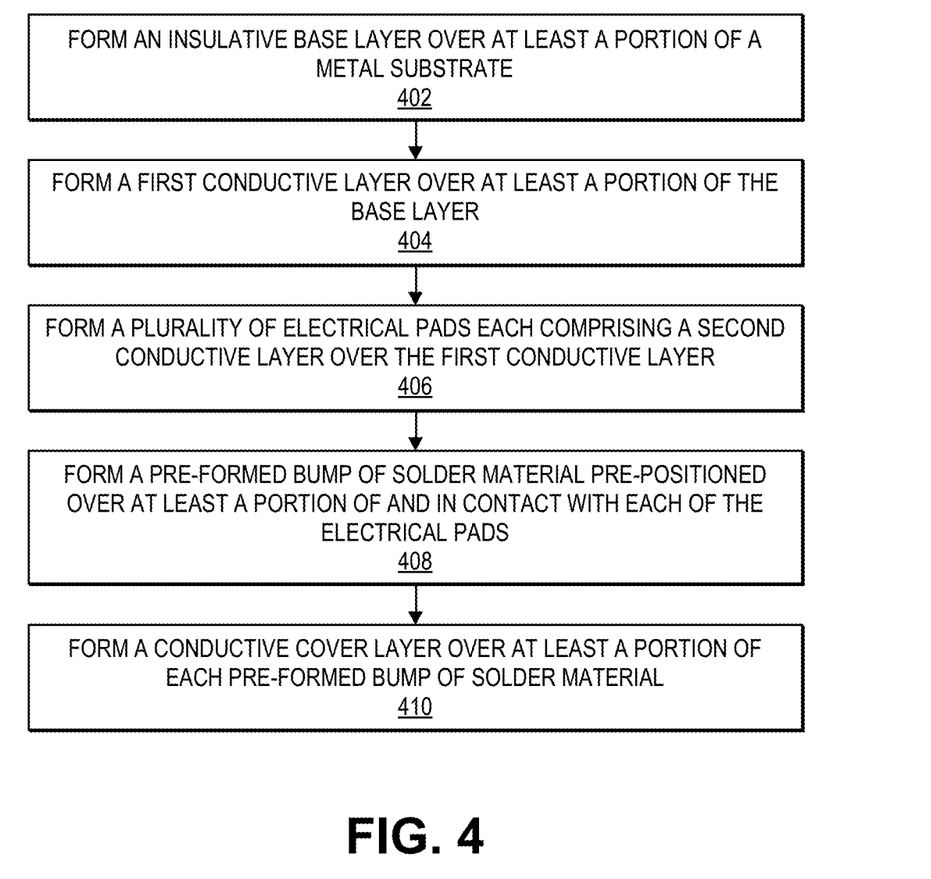
FIG. 4 is a flow diagram illustrating a method of manufacturing a flexure assembly for a hard disk drive, according to an embodiment.

FIG. 4 is a flow diagram illustrating a method of manufacturing a flexure assembly for a hard disk drive, according to an embodiment. FIGS. 5A-5D are each a diagram illustrating the forming of a conductive cover layer over a pre-solder bump, according to respective first-fourth embodiments, and are referenced here in conjunction with the method of FIG. 4.

At block 402, form an insulative base layer over at least a portion of a metal substrate. For example, base layer 502 (FIGS. 5A-5D), such as a polyimide polymer layer, is formed over a metal substrate 501 (FIGS. 5A-5D), such as a stainless steel (SST) layer, according to known manufacturing process techniques.

At block 404, form a first conductive layer over at least a portion of the base layer. For example, first conductive layer 503 (FIGS. 5A-5D), such as a copper printed circuit layer, is formed over the base layer 502 according to known manufacturing process techniques.

At block 406, form a plurality of electrical pads each comprising a second conductive layer over the first conductive layer. For example, a plurality of electrical pads 504 (FIGS. 5A-5D) each comprising a second conductive layer, such as a nickel layer, are formed over the first conductive layer 503 according to known manufacturing process techniques. As depicted in FIGS. 5A-5D and according to embodiments, a head slider 512 (see also head slider 212 of FIG. 2B) constituent to a head-gimbal assembly (HGA) (see, e.g., HGA 210 of FIG. 2B) comprises a plurality of electrical pads 513, located on a trailing edge (TE) opposite a leading edge (LE) of the slider 512, to which the plurality of electrical pads 504 of a flexure 500A (FIG. 5A), 500B (FIG. 5B), 500C (FIG. 5C), 500D (FIG. 5D) are electrically connected.

At block 408, form a pre-formed solder bump of solder material (a "pre-solder bump") pre-positioned over at least a portion of and in contact with each of the electrical pads. For example, a pre-solder bump 505 (FIGS. 5A-5D) of solder material is formed over at least a portion of and in contact with each of the electrical pads 504 of the flexure 500A-500D according to known manufacturing process techniques. For non-limiting examples, solder plating or solder paste printing and reflow techniques may be used to form each pre-solder bump 505. As discussed, solder plating or solder paste printing and reflow techniques may be used to form each pre-solder bump 505, which may employ some form of masking, such as a photoresist (or simply "resist"), in order to properly position the pre-solder bump solder material where desired, i.e., for solder patterning.

At block 410, form a conductive cover layer over at least a portion of each pre-formed bump of solder material. For example, conductive cover layer 506a, 506b, 506c, 506d (FIGS. 5A-5D) is formed over at least a portion of each pre-solder bump 505 of solder material. In view of the conductive cover layer 506a-d, solder material from the pre-solder bump 505 is inhibited from transferring to a probe during electrical check/test of flexure 500A-500D, the solder material is inhibited from oxidizing, and solder splash is inhibited. According to an embodiment, the conductive cover layer 506a-d comprises gold (Au). In this case even if some of the conductive cover layer 506a-d were to transfer to the probe, the probe performance is not expected to deteriorate because of the high conductivity of gold material. Furthermore, gold has a higher thermal conductivity than solder and for the wavelength(s) used for laser reflow, gold shows lower optical absorptance than solder. According to a related embodiment, the conductive cover layer 506a-d is applied as an overcoat by a PVD (physical vapor deposition) process, such as thermal evaporation, sputtering, and the like. Further, according to an embodiment a cover layer 507, such as a polyimide polymer layer, is formed over a portion of the first conductive layer 503 not covered by an electrical pad 504. Responsive to a laser reflow process (see, e.g., FIG. 3C) after slider attach (see, e.g., FIG. 3B), each pre-solder bump 505 is expected to form a solder fillet 505a electrically connecting the flexure 500A-500D and the slider 512, whereby the material (e.g., gold) of the conductive cover layer 506a-d diffuses into the solder material of a corresponding pre-solder bump 505 in forming the solder fillet 505a thereby forming an intermetallic (e.g., Sn—Au) layer.

Figure 5A:
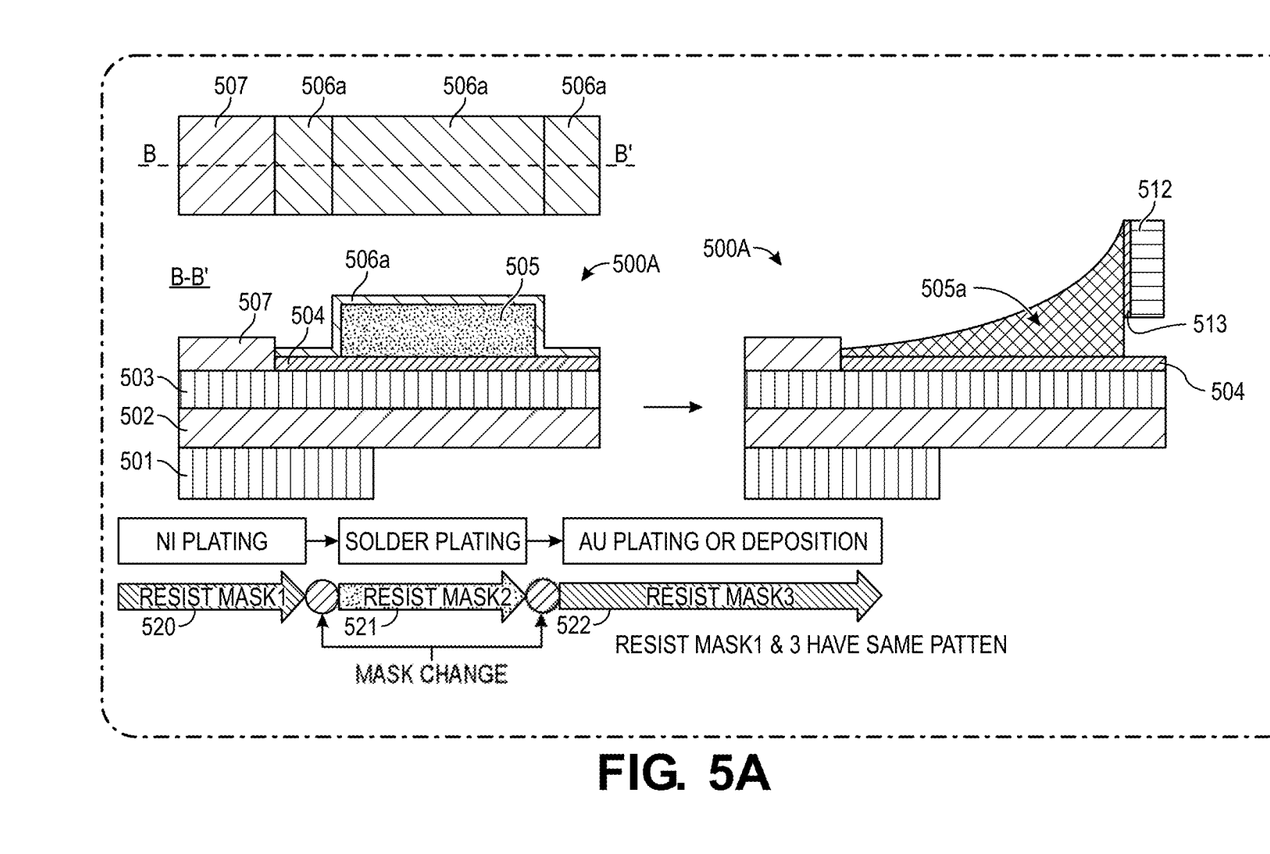
FIG. 5A is a diagram illustrating the forming of a conductive cover layer over a pre-solder bump, according to a first embodiment.

With reference to FIG. 5A and according to an embodiment, the fabrication process depicted involves nickel plating over a first resist mask 520 over the first conductive layer 503 to form the second conductive layer of the plurality of electrical pads 504 (e.g., at block 406), a first mask exchange (removing one mask and applying another mask) to a second resist mask 521 over the second conductive layer for solder plating thereover to form the pre-solder bumps 505 over each of the plurality of electrical pads 504 (e.g., at block 408), and a second mask exchange to a third resist mask 522 for gold plating or deposition thereover to form the conductive cover layer 506a over each pre-solder bump 505 (e.g., at block 410), where the first resist mask 520 and third resist mask 522 may have the same pattern. As depicted in FIG. 5A, according to this embodiment each conductive cover layer 506a is effectively in position over and in contact with, e.g., covers, the entirety of each corresponding pre-solder bump 505, and each conductive cover layer 506a is positioned over and in contact with at least a portion of the second conductive layer of each electrical pad 504 not covered by the pre-solder bump 505.

Figure 5B:
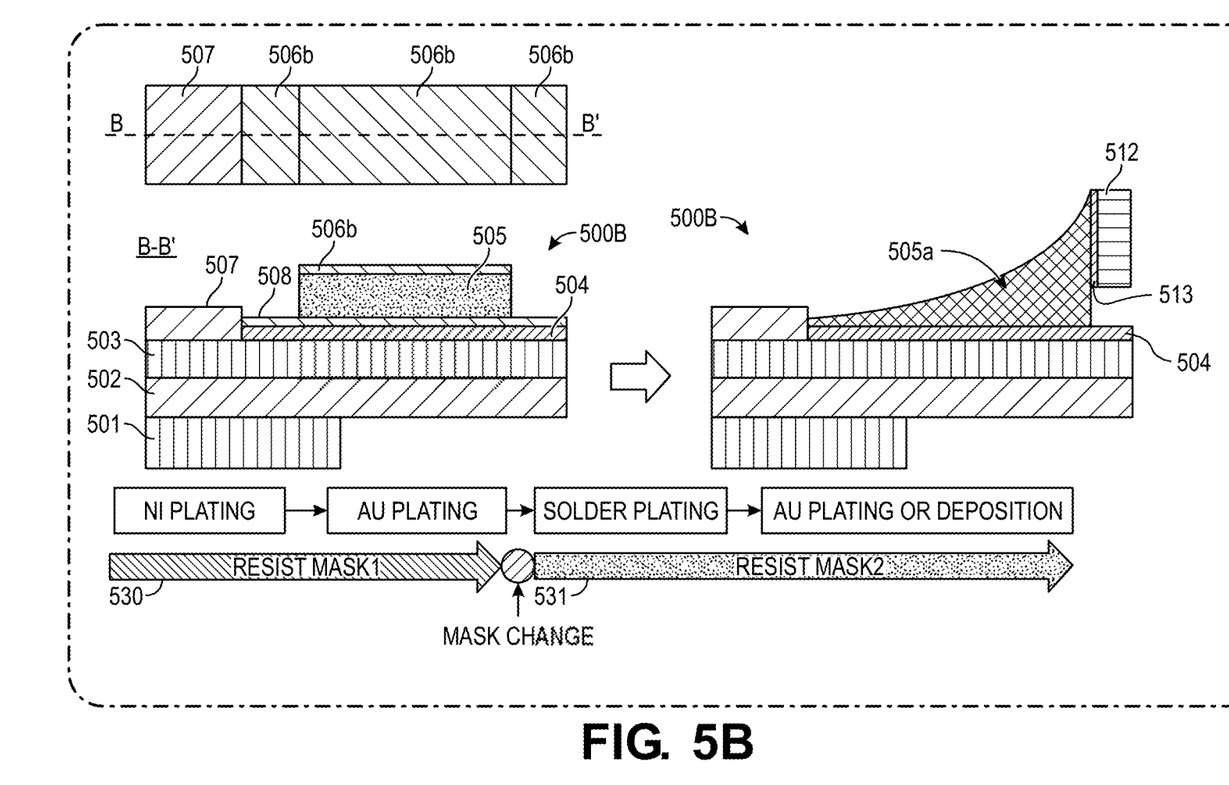
FIG. 5B is a diagram illustrating the forming of a conductive cover layer over a pre-solder bump, according to a second embodiment.

With reference to FIG. 5B and according to an embodiment, a third conductive layer 508 (e.g., gold) is positioned between the second conductive layer of the electrical pads 504 and the pre-solder bumps 505. This third conductive layer 508 provides for anti-oxidation of the first conductive layer 503 (e.g., copper) and stable plating of pre-solder bump 505 as the seed third conductive layer 508 does not oxidize. Furthermore, the melted solder material of pre-solder bump 505 flows to slider electrical pad 513 over the third conductive layer 508 (e.g., gold) more readily during reflow because gold has better solder-wettability than nickel. Here also, one benefit of the use of a nickel layer for electrical pads 504 is as a barrier to diffusion of gold third conductive layer 508 to copper first conductive layer 503. Thus, the fabrication process depicted involves nickel plating over a first resist mask 530 over the first conductive layer 503 to form the second conductive layer of the plurality of electrical pads 504 (e.g., at block 406), gold plating over the first resist mask 530 to form the third conductive layer 508, a first mask exchange to a second resist mask 531 over the third conductive layer for solder plating thereover to form the pre-solder bumps 505 over each of the plurality of electrical pads 504 (e.g., at block 408) and over the third conductive layer 508, and gold plating or deposition thereover to form the conductive cover layer 506*b* over each pre-solder bump 505 (e.g., at block 410). As depicted in FIG. 5B, according to this embodiment each pre-solder bump 505 is positioned over the third conductive (e.g., gold) layer 508 and each conductive cover layer 506*b* is effectively in position over and in contact with only a portion of each corresponding pre-solder bump 505 (e.g., the top surface or portion). Here, only one resist mask exchange is needed. Furthermore, the likelihood of oxidation on the side surfaces of each solder bump 505 is not considered as significant as with no conductive cover layer 506*b* because the area of side surfaces is much smaller than that of top surface.

Figure 5C:
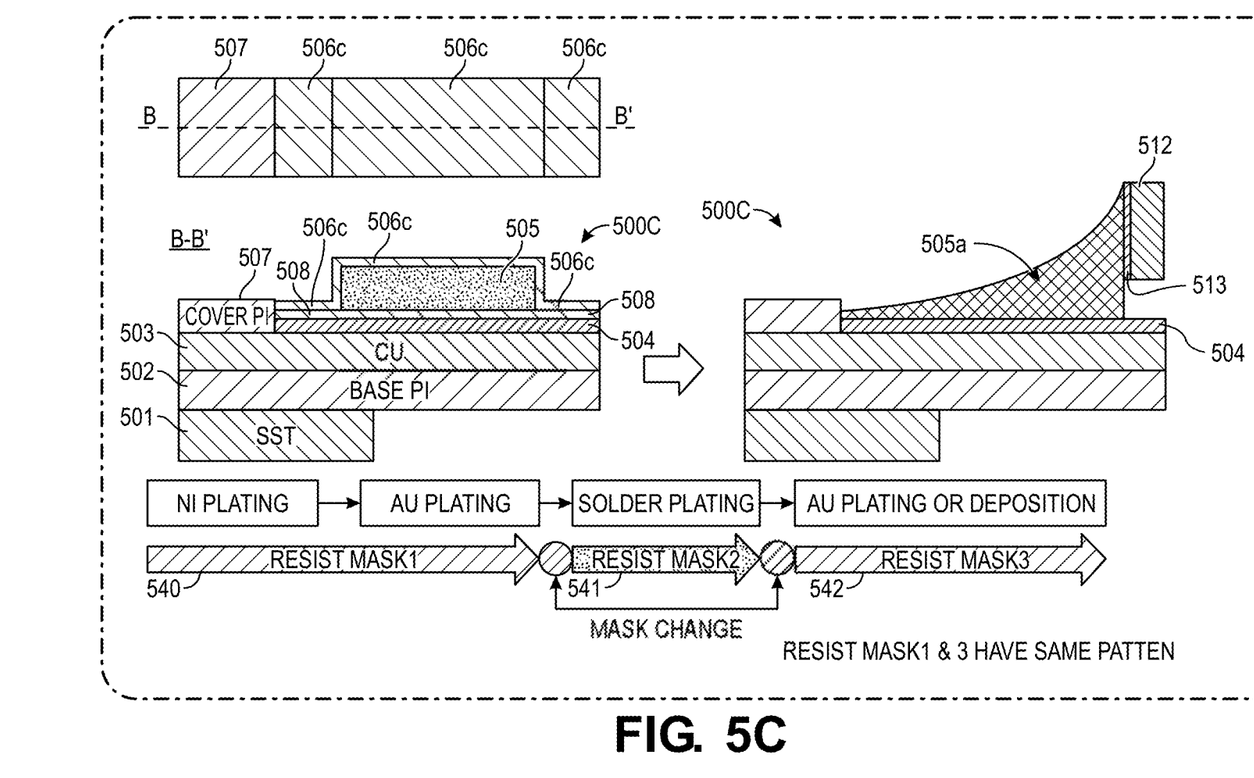
FIG. 5C is a diagram illustrating the forming of a conductive cover layer over a pre-solder bump, according to a third embodiment.

With reference to FIG. 5C and according to an embodiment, a third conductive layer 508 (e.g., gold) is positioned between the second conductive layer of the electrical pads 504 and the pre-solder bumps 505. Thus, the fabrication process depicted involves nickel plating over a first resist mask 540 over the first conductive layer 503 to form the second conductive layer of the plurality of electrical pads 504 (e.g., at block 406), gold plating over the first resist mask 540 to form the third conductive layer 508 over the second conductive layer of the plurality of electrical pads 504, a first mask exchange to a second resist mask 541 for solder plating thereover to form the pre-solder bumps 505 over each of the plurality of electrical pads 504 (e.g., at block 408), and a second mask exchange to a third resist mask 542 for gold plating or deposition thereover to form the conductive cover layer 506*c* over each pre-solder bump 505 (e.g., at block 410), where the first resist mask 540 and third resist mask 542 may have the same pattern. As depicted in FIG. 5C, according to this embodiment each conductive cover layer 506*c* is effectively in position over and in contact with, e.g., covers, the entirety of each corresponding pre-solder bump 505.

Figure 5D:
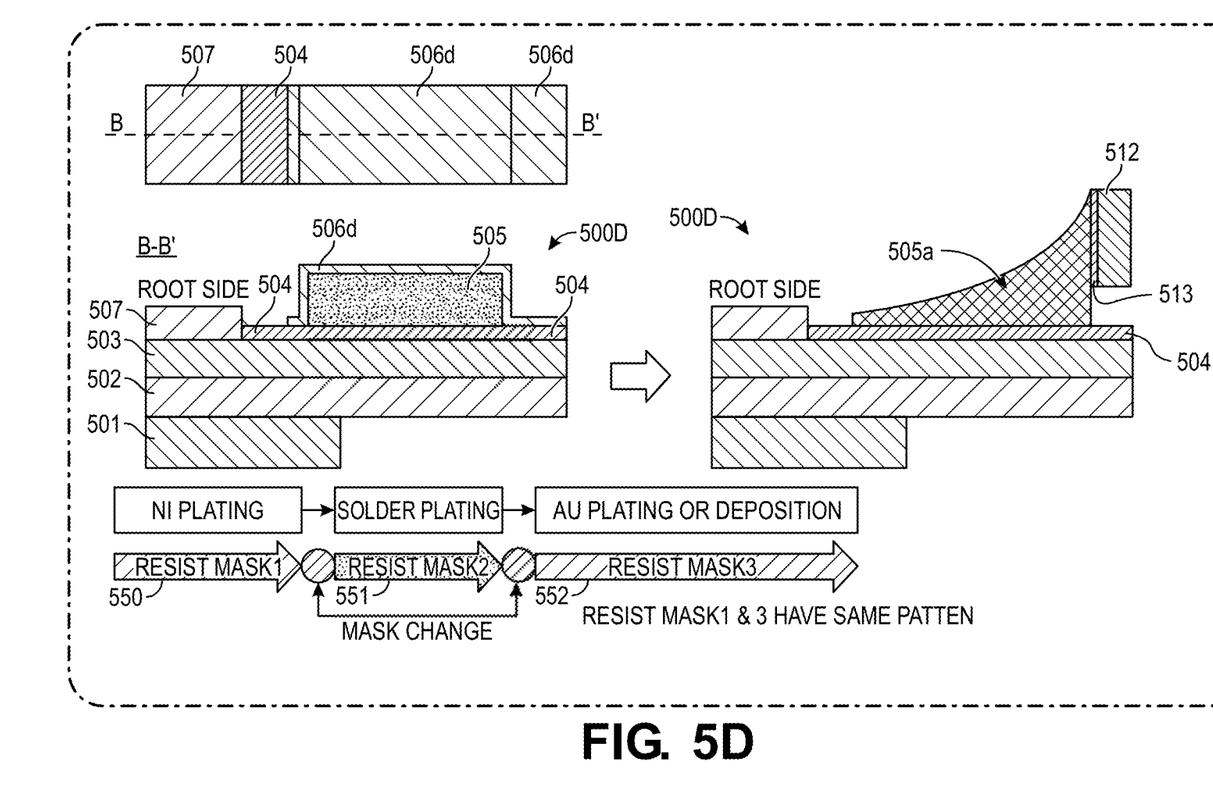
FIG. 5D is a diagram illustrating the forming of a conductive cover layer over a pre-solder bump, according to a fourth embodiment.

With reference to FIG. 5D and according to an embodiment, the fabrication process depicted involves nickel plating over a first resist mask 550 over the first conductive layer 503 to form the second conductive layer of the plurality of electrical pads 504 (e.g., at block 406), a first mask exchange to a second resist mask 551 over the second conductive layer for solder plating thereover to form the pre-solder bumps 505 over each of the plurality of electrical pads 504 (e.g., at block 408), and a second mask exchange to a third resist mask 552 over the second conductive layer for gold plating or deposition thereover to form the conductive cover layer 506*d* over each pre-solder bump 505 (e.g., at block 410). As depicted in FIG. 5D, according to this embodiment each conductive cover layer 506*d* is effectively in position over and in contact with, e.g., covers, the entirety of each corresponding pre-solder bump 505, and each conductive cover layer 506*d* is positioned over and in contact with only a portion of the second conductive layer of each electrical pad 504 not covered by the pre-solder bump 505. Here, the pre-solder bump 505 is positioned over the second conductive layer (e.g., nickel), with the entire pre-solder bump 505 covered by the conductive cover layer 506*d* but with a portion of the second conductive layer exposed on the root side (furthest from the slider 512), so that during reflow the solder material of pre-solder bump 505 is more likely to flow toward the slider 512 rather than toward the cover layer 507 due to the relatively low wettability of the exposed nickel material. Thus, the solder material is efficiently used for pad connection.

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

Figure 1:
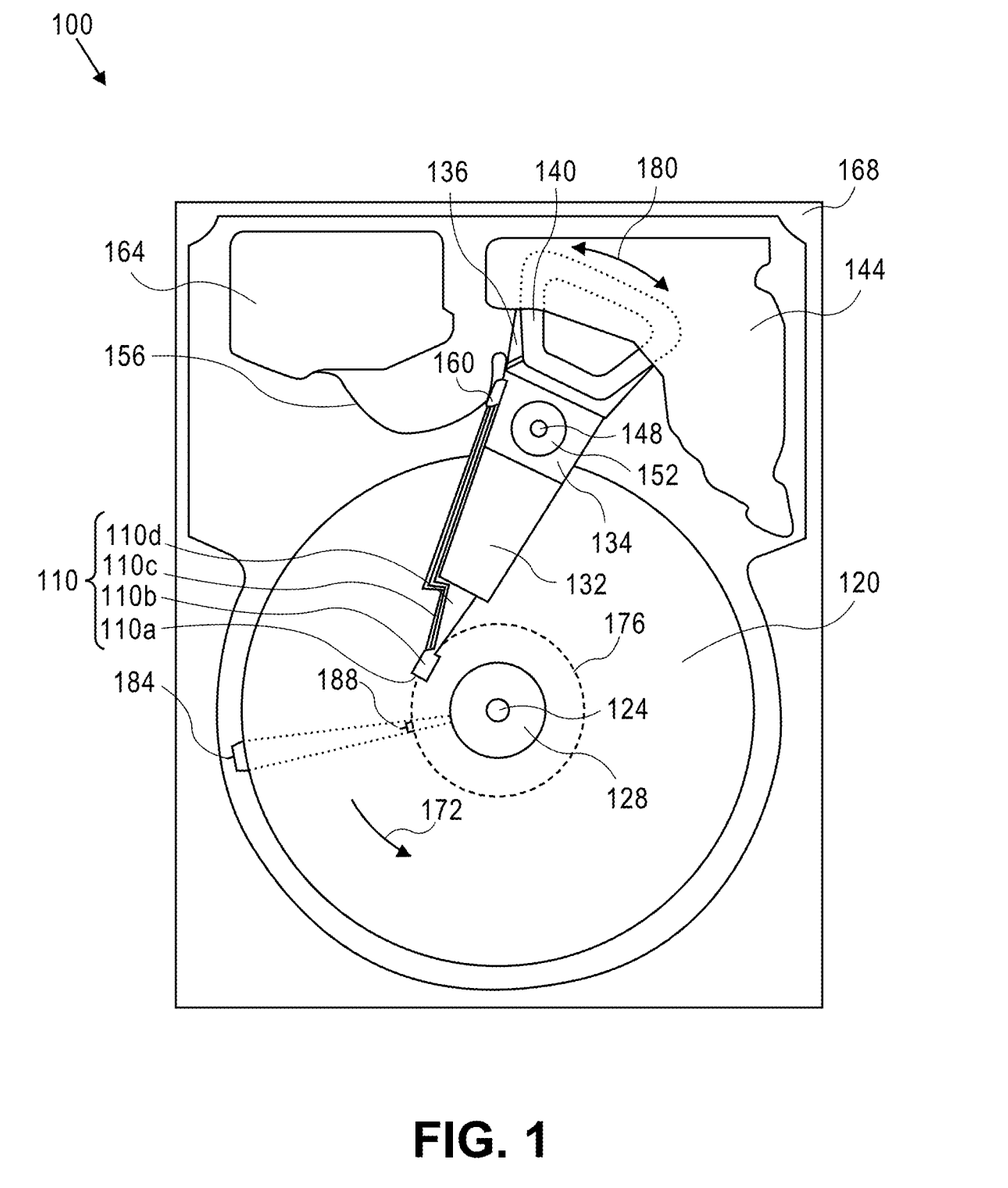
FIG. 1 is a plan view illustrating a hard disk drive (HDD), according to an embodiment.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110*a*, are transmitted by a flexible cable assembly (FCA) 156 (or "flex cable", or "flexible printed circuit" (FPC)). Interconnection between the flex cable 156 and the head 110*a* may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feedthrough provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A flexure for a suspension assembly for a hard disk drive (HDD), the flexure comprising:
    a metal substrate;
    an insulative base layer over at least a portion of the substrate;
    a first conductive layer over at least a portion of the base layer;
    a plurality of electrical pads, each electrical pad comprising a second conductive layer over the first conductive layer and configured for electrical connectivity with a corresponding electrical pad of a head slider;
    a pre-formed bump of solder material pre-positioned over at least a portion of each electrical pad of the plurality of electrical pads of the flexure; and
    a conductive cover layer over and in contact with the entire exposed portion of each pre-formed bump of solder material.

2. The flexure of claim 1, wherein each conductive cover layer comprises gold.

3. The flexure of claim 1, wherein each conductive cover layer is positioned over and in contact with at least a portion of each electrical pad, of the plurality of electrical pads of the flexure, not covered by the pre-formed bump of solder material.

4. The flexure of claim 1, wherein the second conductive layer of each electrical pad of the plurality of electrical pads of the flexure comprises nickel.

5. The flexure of claim 1, wherein:
the second conductive layer of each electrical pad of the plurality of electrical pads of the flexure comprises nickel; and
each conductive cover layer is positioned over and in contact with only a portion of each second conductive layer.

6. The flexure of claim 1, further comprising:
a third conductive layer between the second conductive layer and the pre-formed bump of solder material.

7. The flexure of claim 6, wherein the third conductive layer comprises gold.

8. The flexure of claim 7, wherein each conductive cover layer is positioned over and in contact with at least a portion of each third conductive layer not covered by the pre-formed bump of solder material.

9. A method for manufacturing a flexure assembly for a hard disk drive, the method comprising:
forming an insulative base layer over at least a portion of a metal substrate;
forming a first conductive layer over at least a portion of the base layer;
forming a plurality of electrical pads, each electrical pad comprising a second conductive layer over the first conductive layer and configured for electrical connectivity with a corresponding electrical pad of a head slider;
forming a pre-formed bump of solder material pre-positioned over at least a portion of and in contact with each of the electrical pads of the plurality of electrical pads of the flexure assembly; and
forming a conductive cover layer over the entire exposed portion of each pre-formed bump of solder material.

10. The method of claim 9, further comprising:
prior to forming the second conductive layer, applying a first mask over the first conductive layer for forming each second conductive layer;
prior to forming the pre-formed bump of solder material, removing the first mask and applying a second mask over the second conductive layer for forming each pre-formed bump of solder material; and
prior to forming the conductive cover layer, applying a third mask for forming each conductive cover layer;
wherein the first mask and the third mask have the same pattern.

11. The method of claim 9, further comprising:
prior to forming the second conductive layer, applying a first mask over the first conductive layer for forming each second conductive layer;
forming a third conductive layer between the second conductive layer and the pre-formed bump of solder material; and
prior to forming the pre-formed bump of solder material, removing the first mask and applying a second mask over the third conductive layer for forming each pre-formed bump of solder material.

12. The method of claim 9, further comprising:
prior to forming the second conductive layer, applying a first mask over the first conductive layer for forming each second conductive layer;
forming a third conductive layer between the second conductive layer and the pre-formed bump of solder material;
prior to forming the pre-formed bump of solder material, removing the first mask and applying a second mask for forming each pre-formed bump of solder material; and
prior to forming the conductive cover layer, applying a third mask for forming each conductive cover layer;
wherein the first mask and the third mask have the same pattern.

13. The method of claim 9, further comprising:
prior to forming the second conductive layer, applying a first mask over the first conductive layer for forming each second conductive layer comprising nickel;
prior to forming the pre-formed bump of solder material, removing the first mask and applying a second mask over the second conductive layer for forming each pre-formed bump of solder material; and
prior to forming the conductive cover layer, applying a third mask over the second conductive layer for forming each conductive cover layer;
wherein the third mask is patterned such that each conductive cover layer is positioned over only a portion of each second conductive layer.

14. The method of claim 9, further comprising:
electrically connecting the plurality of electrical pads of the flexure assembly to the corresponding electrical pads of the head slider employing laser irradiation of each pre-formed bump of solder material.

15. A hard disk drive (HDD) comprising:
a disk medium rotatably mounted on a spindle;
a suspension assembly comprising a flexure comprising:
a metal substrate,
an insulative base layer over at least a portion of the substrate,
a copper layer over at least a portion of the base layer,
a plurality of electrical pads, each electrical pad comprising a nickel layer over the copper layer,
a pre-formed bump of solder material pre-positioned over at least a portion of each electrical pad of the plurality of electrical pads, and
a gold cover layer over and in contact with the entire exposed portion of each pre-formed bump of solder material;
a head slider housing a read-write transducer configured to read from and to write to the disk medium, the head slider mounted on the suspension assembly and electrically connected to the plurality of electrical pads of the flexure via the pre-formed bump of solder material; and
means for moving the head slider to access portions of the disk medium.

16. The HDD of claim 15, wherein each gold cover layer is positioned over and in contact with at least a portion of each electrical pad, of the plurality of electrical pads, not covered by the pre-formed bump of solder material.

17. The HDD of claim 15, wherein each gold cover layer is positioned over and in contact with only a portion of each nickel layer.

18. The HDD of claim 15, wherein the flexure further comprises a second gold layer between the nickel layer and the pre-formed bump of solder material.

19. The HDD of claim 18, wherein each gold cover layer is positioned over and in contact with at least a portion of each second gold layer not covered by the pre-formed bump of solder material.

* * * * *